(12) United States Patent
Ji et al.

(10) Patent No.: US 10,879,000 B2
(45) Date of Patent: Dec. 29, 2020

(54) MULTILAYER CERAMIC ELECTRONIC COMPONENT AND INTERPOSER INCLUDED THEREIN

(71) Applicant: SAMSUNG ELECTRO-MECHANICS CO., LTD., Suwon-si, Gyeonggi-do (KR)

(72) Inventors: Gu Won Ji, Suwon-si (KR); Ho Yoon Kim, Suwon-si (KR); Heung Kil Park, Suwon-si (KR); Sang Soo Park, Suwon-si (KR); Woo Chul Shin, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/213,900

(22) Filed: Dec. 7, 2018

(65) Prior Publication Data
US 2020/0118745 A1   Apr. 16, 2020

(30) Foreign Application Priority Data
Oct. 12, 2018  (KR) .................. 10-2018-0122109

(51) Int. Cl.
*H01G 2/06*     (2006.01)
*H01G 4/12*     (2006.01)
(Continued)

(52) U.S. Cl.
CPC .............. *H01G 2/065* (2013.01); *H01G 4/12* (2013.01); *H01G 4/232* (2013.01); *H01G 4/30* (2013.01);
(Continued)

(58) Field of Classification Search
CPC .......... H01G 4/005; H01G 4/012; H01G 4/12; H01G 4/30; H01G 4/224; H01G 4/248;
(Continued)

(56) References Cited

U.S. PATENT DOCUMENTS

| 2005/0286204 A1* | 12/2005 | Yamaguchi | ............... H01G 4/30 |
| | | | 361/301.5 |
| 2014/0041914 A1* | 2/2014 | Hattori | ................... H05K 1/181 |
| | | | 174/260 |

(Continued)

FOREIGN PATENT DOCUMENTS

| JP | 2009-266499 | * | 4/2008 | ............. H01R 13/03 |
| JP | 2014-57046 A | | 3/2014 | |

(Continued)

OTHER PUBLICATIONS

Office Action dated Sep. 20, 2019, issued in corresponding Korean Patent Application No. 10-2018-0122109.

*Primary Examiner* — Timothy J Thompson
*Assistant Examiner* — Guillermo J Egoavil
(74) *Attorney, Agent, or Firm* — Morgan, Lewis & Bockius LLP

(57)  ABSTRACT

A multilayer ceramic electronic component includes a ceramic body including dielectric layers and first and second internal electrodes, first and second external electrode disposed on first and second external surfaces of the ceramic body to be electrically connected to the first and second internal electrodes, respectively, and an interposer including an insulating body having first and second recess regions and first and second terminal electrodes. The first and second recess regions are disposed in a central region of the insulating body in a width direction. A/B is within a range from 0.14 or more to 0.51 or less, where A is an area of each of the first and second recess regions, viewed in a cross-section in length and width directions, and B is an area of (Continued)

each of the first and second terminal electrodes, viewed in the cross-section in the length and width directions.

11 Claims, 5 Drawing Sheets

(51) Int. Cl.
*H01G 4/232* (2006.01)
*H01G 4/30* (2006.01)
*H05K 1/11* (2006.01)
*H05K 3/30* (2006.01)

(52) U.S. Cl.
CPC ............ *H05K 1/111* (2013.01); *H05K 3/301* (2013.01); *H05K 2201/10378* (2013.01)

(58) Field of Classification Search
CPC .......... H01G 2/065; H01G 2/06; H01G 4/018; H01G 4/232; H01G 4/40; H01G 4/228; H05K 3/46; H05K 1/18; H05K 1/14; H05K 1/111; H05K 1/11; H05K 1/181; H05K 3/301; H05K 3/3442; H05K 3/30; H05K 2201/10015; H05K 2201/10378; H05K 2201/10636; H05K 2201/2045; H01C 1/14; H01C 1/148; H01C 7/18; Y02P 70/50
USPC ........................................ 361/301.4; 174/260
See application file for complete search history.

(56) References Cited

U.S. PATENT DOCUMENTS

| | | | |
|---|---|---|---|
| 2014/0116768 A1* | 5/2014 | Hattori | H01G 2/065 174/260 |
| 2014/0124256 A1* | 5/2014 | Hattori | H01G 2/065 174/260 |
| 2014/0268486 A1* | 9/2014 | Hattori | H01G 4/308 361/301.4 |
| 2014/0284089 A1 | 9/2014 | Hattori et al. | |
| 2015/0096792 A1* | 4/2015 | Ogawa | H01G 2/065 174/255 |
| 2015/0131253 A1* | 5/2015 | Park | H01G 4/236 361/782 |
| 2015/0270065 A1* | 9/2015 | Hattori | H01G 2/065 174/255 |
| 2016/0088733 A1 | 3/2016 | Lee et al. | |
| 2016/0111215 A1* | 4/2016 | Park | H01C 1/148 174/260 |
| 2016/0133386 A1 | 5/2016 | Park et al. | |

FOREIGN PATENT DOCUMENTS

| | | | | |
|---|---|---|---|---|
| JP | 2014-207422 A | 10/2014 | | |
| KR | 10-1514565 A | 4/2015 | | |
| KR | 10-2016-0033492 A | 3/2016 | | |
| KR | 10-2016-0044249 A | 4/2016 | | |
| KR | 10-2016-0055424 A | 5/2016 | | |
| KR | 101656294 B1 * | 9/2016 | ............. | H05K 1/181 |

\* cited by examiner

MULTILAYER CERAMIC ELECTRONIC COMPONENT AND INTERPOSER INCLUDED THEREIN

CROSS-REFERENCE TO RELATED APPLICATION(S)

This application claims the benefit of priority to Korean Patent Application No. 10-2018-0122109 filed on Oct. 12, 2018 in the Korean Intellectual Property Office, the disclosure of which is incorporated herein by reference in its entirety.

TECHNICAL FIELD

The present disclosure relates to a multilayer ceramic electronic component and an interposer included therein.

BACKGROUND

Multilayer ceramic electronic components are widely used as IT components of computers, PDAs, mobile phones, and the like due to advantages thereof such as compactness, high capacitance, and ease of mounting. Also, such multilayer ceramic electronic components are widely used as electric components due to high reliability and high strength characteristics thereof.

A multilayer ceramic electronic component may cause acoustic noise due to an internal piezoelectric effect. Such acoustic noise may propagate to a board to cause noise that can be perceived by a person and to malfunctioning of nearby sensors.

SUMMARY

An aspect of the present disclosure may provide a multilayer ceramic electronic component having reduced noise and improved adhesion strength thereof to a board, and an interposer included in the multilayer ceramic electronic component.

According to an aspect of the present disclosure, a multilayer ceramic electronic component includes a ceramic body including dielectric layers and first and second internal electrodes alternately laminated with each of the dielectric layers disposed therebetween to be respectively exposed to a first external surface and a second external surface of the ceramic body, first and second external electrodes disposed on first and second external surfaces of the ceramic body to be electrically connected to the first and second internal electrodes, respectively, and an interposer including an insulating body disposed on a first side of the ceramic body and having first and second recess regions disposed at first and second ends of the insulating body, in a length direction, and first and second terminal electrodes disposed to cover the first and second ends of the insulating body, respectively, and electrically connected to the first and second external electrodes, respectively. The first and second recess regions are disposed in a central region of the insulating body in a width direction, respectively. A/B is within a range from 0.14 or more to 0.51 or less, where A is an area of each of the first and second recess regions, viewed in a cross-section in length and width directions, and B is an area of each of the first and second terminal electrodes, viewed in the cross-section in the length and width directions.

According to an aspect of the present disclosure, an interposer includes an insulating body having first and second recess regions at first and second ends of the insulating body in a length direction and first and second terminal electrodes disposed to cover side surfaces of the insulating body, on which the first and second recess regions are disposed, in the length direction and to cover a portion of an upper surface and a portion of a lower surface of the insulating body. The first and second recess regions are disposed in a central region of the insulating body in a width direction, respectively. A/B is within a range from 0.14 or more to 0.51 or less, where A is an area of each of the first and second recess regions, viewed in a cross-section in length and width directions, and B is an area of each of the first and second terminal electrodes, viewed in the cross-section in the length and width directions.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1A:
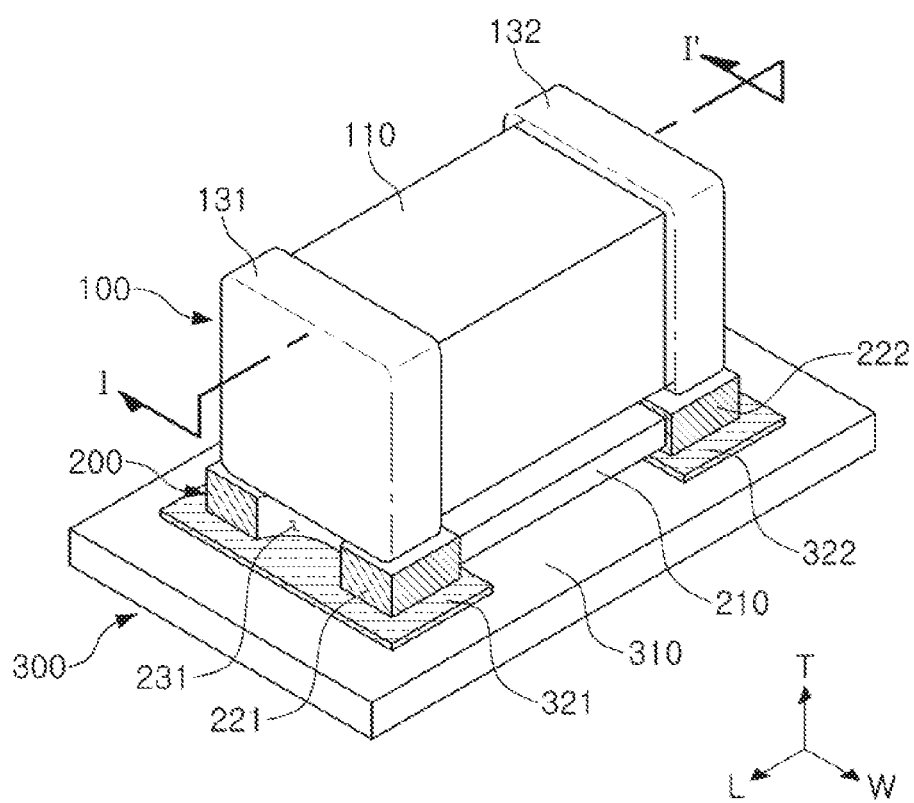
FIG. 1A is a perspective view of a multilayer ceramic electronic component according to an exemplary embodiment in the present disclosure.

Hereinafter, embodiments of the present disclosure will be described as follows with reference to the attached drawings. The present disclosure may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

Through the specification, in addition, unless explicitly described to the contrary, the word "comprise" and variations such as "comprises" or "comprising," will be understood to imply the inclusion of stated elements but not the exclusion of any other elements.

Directions of a hexahedral ceramic body will be defined in order to clearly describe an embodiment of the invention. L, W and T shown throughout the drawings refer to a length direction, a width direction, and a thickness direction, respectively. Here, the thickness direction may be the same as a direction in which dielectric layers are laminated.

Hereinafter, a multilayer ceramic electronic component according to an exemplary embodiment in the present disclosure will be described. In detail, a multilayer ceramic capacitor will be described. However, the present disclosure is not limited thereto.

Figure 1B:
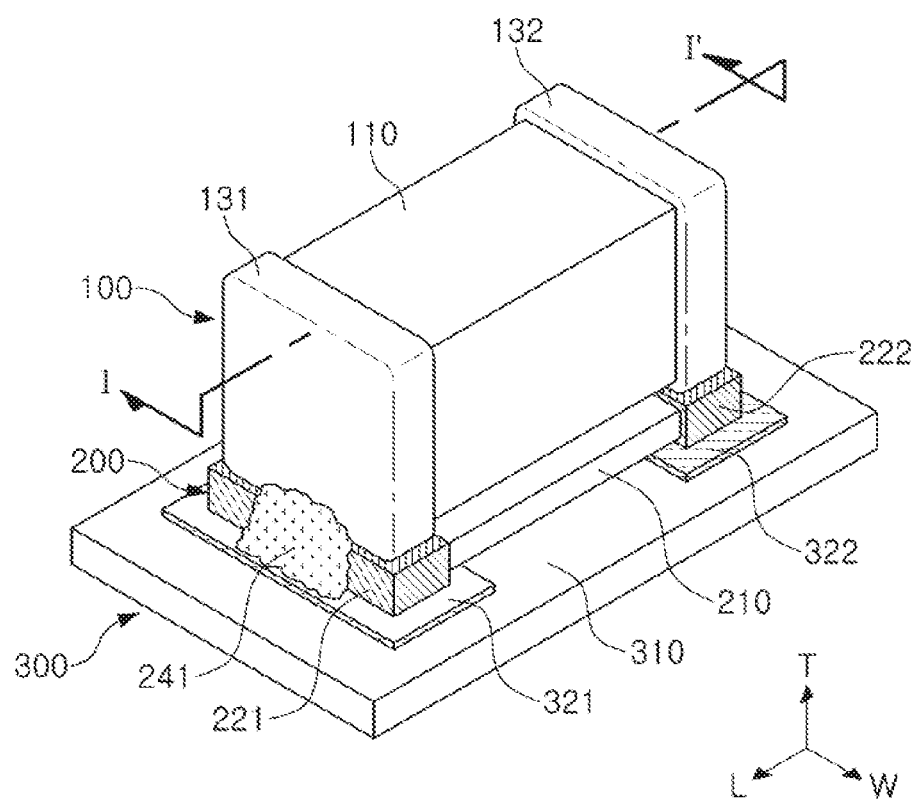
FIG. 1B is a perspective view of a structure in which solders are added to a multilayer ceramic electronic component according to an exemplary embodiment in the present disclosure.
Figure 2:
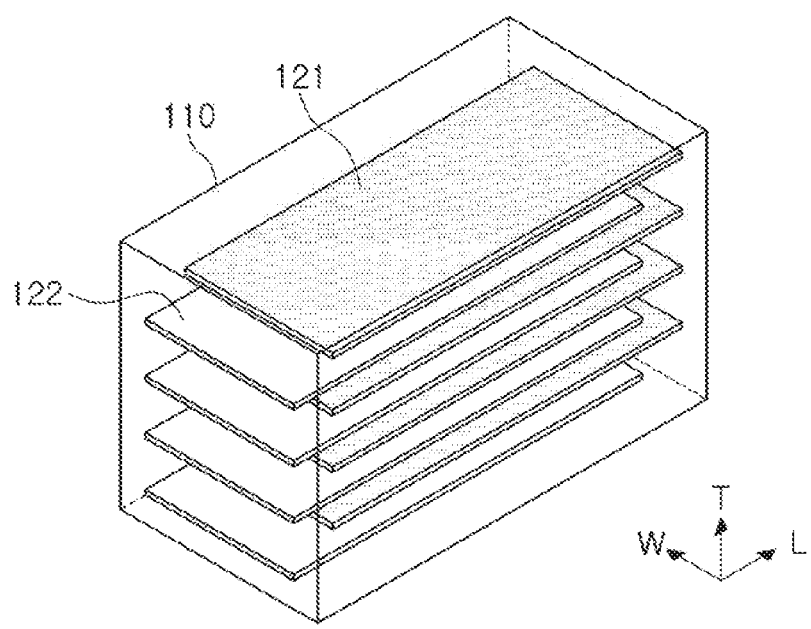
FIG. 2 is a perspective view illustrating the inside of a ceramic body of a multilayer electronic component according to an exemplary embodiment in the present disclosure.

FIG. 1A is a perspective view of a multilayer ceramic electronic component according to an exemplary embodiment in the present disclosure, and FIG. 1B is a perspective view of a structure in which solders are added to a multilayer ceramic electronic component according to an exemplary embodiment in the present disclosure. FIG. 2 is a perspective view illustrating the inside of a ceramic body of a multilayer electronic component according to an exemplary embodiment in the present disclosure, and FIG. 3 is a side view of a multilayer ceramic electronic component according to an exemplary embodiment in the present disclosure.

Figure 3:
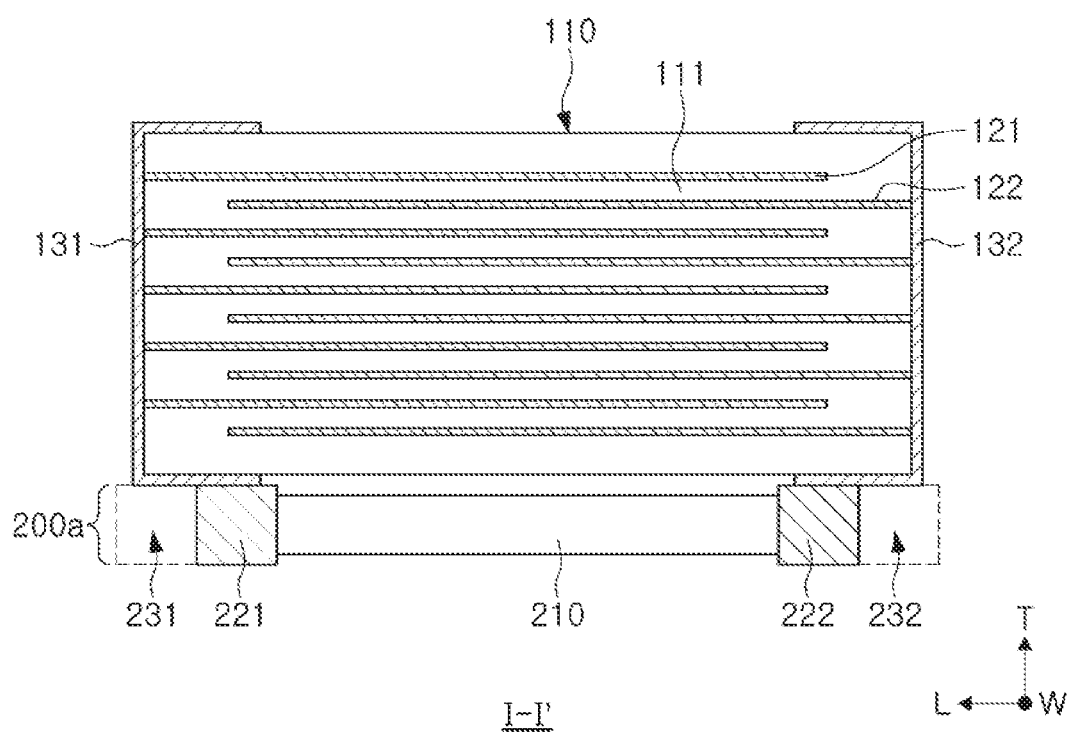
FIG. 3 is a side view of a multilayer ceramic electronic component according to an exemplary embodiment in the present disclosure.

Referring to FIGS. 1A and 3, a multilayer ceramic electronic component 100 according to an exemplary embodiment includes a ceramic body 110 and first and second external electrodes 131 and 132.

The ceramic body 110 may be formed as a hexahedron having two surfaces in a length direction L, two surfaces in a width direction W, and two surfaces in a thickness direction T. The ceramic body 110 may be formed by laminating a plurality of dielectric layers 111 in the thickness direction T and then sintering the plurality of dielectric layers 111. Shapes and dimensions of the ceramic body 110 and the number of laminated dielectric layers 111 (one or more) are not limited to those of an example illustrated in the exemplary embodiment.

The plurality of dielectric layers 111 disposed in the ceramic body 110 may be in a sintered state, and adjacent dielectric layers 111 may be integrated with each other so that boundaries therebetween are not readily apparent without using a scanning electron microscope (SEM).

For example, the ceramic body 110 may have a round shape with eight corners in a hexahedron. Accordingly, durability and reliability of the ceramic body 110 may be improved, and structural reliability of the first and second external electrodes 131 and 132 at the corners may be improved.

A thickness of the dielectric layer 111 may be arbitrarily changed in accordance with a capacitance design of the multilayer ceramic electronic component 100, and the dielectric layer 111 may contain ceramic powder particles having a high dielectric constant, such as barium titanate ($BaTiO_3$)-based powder particles or strontium titanate ($SrTiO_3$)-based powder particles. However, a material thereof is not limited thereto. Further, various ceramic additives, an organic solvent, a plasticizer, a binder, a dispersant, and the like, may be added to the ceramic powder particles, according to the object of the present disclosure.

An average particle size of a ceramic powder used to form the dielectric layer 111 is not limited and may be controlled to achieve the object of the present disclosure. For example, the average particle size may be controlled to be 400 nanometers (nm) or less. Accordingly, the multilayer ceramic electronic component 100 according to an exemplary embodiment may be used as a component requiring a large size and high capacitance as in the case of IT components.

For example, the dielectric layer 111 may be formed by applying slurry containing a powder such as a barium titanate ($BaTiO_3$)-based powder to carrier films and drying the applied slurry to prepare a plurality of ceramic sheets. The ceramic sheet may be manufactured by mixing the ceramic powder, a binder, and a solvent to prepare the slurry and manufacturing the prepared slurry in a sheet shape having a thickness of several micrometers (μm) by a doctor blade method, but the manufacturing method of the ceramic sheet is not limited thereto.

The first and second external electrodes 131 and 132 may be disposed on first and second external surfaces (for example, one external surface and the other external surfaces in the length direction) of the ceramic body 110 to be connected to first and second internal electrodes, respectively. Also the first and second external electrodes 131 and 132 may be configured to electrically connect the first and second internal electrodes to a board.

For example, the first and second external electrodes 131 and 132 may be formed of one of copper (Cu), palladium (Pd), platinum (Pt), gold (Au), silver (Ag), and lead (Pb), or alloys thereof.

For example, the first and second external electrodes 131 and 132 may include first and second electrode layers containing copper (Cu) or nickel (Ni) and first and second plating layers disposed on the first and second electrode layers and containing nickel (Ni) and tin (Sn).

The first and second electrode layers may be formed by dipping the ceramic body 110 in a paste containing a metal ingredient or printing a conductive paste containing a conductive metal on at least one surface of the ceramic body 100 in the thickness direction T. Alternatively, the first and second electrode layers may be formed by a sheet transfer method or a pad transfer method.

The first and second plating layers may be formed by a sputtering method or an electric deposition method, but a forming method thereof is not limited thereto.

Referring to FIG. 2, the ceramic body 110 includes first and second internal electrodes 121 and 122 and a plurality of dielectric layers.

The first and second internal electrodes 121 and 122 are alternately laminated with each of the dielectric layers disposed therebetween to be exposed to a first external surface and a second external surface of the ceramic body 110 (for example, one external surface and the other external surface of the ceramic body 110 in the length direction) to have polarities different from each other.

The first internal electrodes 121 and the second internal electrodes 122 may be formed in a laminating direction of the dielectric layers to be alternately exposed to one external surface and the other external surface of the ceramic body 110 in the length direction L of the ceramic body 110 and may be formed of a conductive paste containing a conductive metal printed thereon. The first internal electrodes 121 and the second internal electrodes 122 may be electrically insulated from each other by each of the dielectric layers disposed therebetween.

For example, the first and second internal electrodes 121 and 122 may be electrically connected to the first and second external electrodes 131 and 132 disposed on both external surfaces of the ceramic body 110 in the length direction L of the ceramic body 110 through portions alternately exposed to both external surfaces of the ceramic body 110 in the length direction L of the ceramic body 110, respectively.

For example, the first and second internal electrodes 121 and 122 by formed by a conductive paste for an internal electrode having an average particle size of 0.1 to 0.2 μm and containing 40 wt % to 50 wt % of conductive metal powder particles, but the conductive paste thereof is not limited thereto.

The conductive paste for an internal electrode may be applied to the ceramic sheets by a printing method, or the like, to form internal electrode patterns. A method of printing the conductive paste may be a screen printing method, a gravure printing method, or the like, but is not limited thereto. Two hundred or three hundred ceramic sheets on which the internal electrode pattern is printed may be laminated, pressed, and sintered to manufacture the ceramic body 110.

Accordingly, when a voltage is applied to the first and second eternal electrodes 131 and 132 opposing each other, charges are accumulated between the first and second internal electrodes 121 and 122. In this case, capacitance of the multilayer ceramic electronic component 100 is in proportion to an area of a region in which the first and second internal electrodes 121 and 122 overlap each other.

For example, when the overlapping area of the first and second internal electrodes 121 and 122 is significantly increased, capacitance of even a capacitor having the same size may be significantly increased.

Thicknesses of the first and second internal electrodes 121 and 122 may be determined depending on intended usage thereof. For example, each of the thicknesses of the first and second internal electrodes 121 and 122 may be 0.4 μm or less.

In addition, the number of the first and second internal electrodes 121 and 122 laminated may be 400 or more. Thus, the multilayer ceramic electronic component 100 may be used as an IT component requiring compactness and high capacitance.

Since a thickness of a dielectric layer corresponds to a distance between the first and second internal electrodes 121 and 122, the capacitance of the multilayer ceramic electronic component 100 may be increased as the thickness of the dielectric layer is decreased.

The first and second internal electrodes 121 and 122 may be formed of one of nickel (Ni), copper (Cu), palladium (Pd), silver (Ag), lead (Pb), and platinum (Pt), or alloys thereof, but a material thereof is not limited thereto.

Withstand voltage characteristics of the ceramic body 110 may be improved as the distance between the first and second internal electrodes 121 and 122 is increased.

In the case in which the multilayer ceramic electronic component 100 is required to have withstand voltage characteristics that are as high as those of an electric component, the multilayer ceramic electronic component 100 may be designed in such a manner that an average thickness of dielectric layers may exceed twice an average thickness of the first and second internal electrodes 121 and 122. Accordingly, the multilayer ceramic electronic component 100 may have high withstand voltage characteristics to be used as an electric component.

Durability (for example, flexural strength) of the ceramic body 110 may have improved reliability when a width of the ceramic body exceeds 0.5 times a thickness thereof.

Referring to FIG. 1A, the multilayer ceramic electronic component 100 according to an exemplary embodiment may include an interposer 200 and may further include first and second electrode pads 321 and 322 disposed between a board 300 and the interposer 200. The board 300 may include a base member 310.

The interposer 200 may include an insulating body 210 and first and second terminal electrodes 221 and 222 and may attenuate acoustic noise which may be generated in the ceramic body 110 while suppressing transmission of the acoustic noise to the board 300 below the interposer 200. Thus, the acoustic noise may be reduced.

For example, the insulating body 210 may be formed using the same material as an insulating layer as a printed circuit board (PCB) and may be implemented to have the same high Young's modulus as alumina to effectively reduce the acoustic noise of the ceramic body 110.

The insulating body 210 is disposed on a lower side of the ceramic body 210 and has first and second recess regions 231 and 232 disposed at one end and the other end of the insulating body 210 in the length direction L.

The first and second terminal electrodes 221 and 222 may be disposed to cover side surfaces of the insulating body 210, on which the first and second recess regions 231 and 232 are disposed, respectively. The first and second terminal electrodes 221 and 222 may be electrically connected to the first and second external electrodes 131 and 132, respectively, and may be connected to first and second electrode pads 321 and 322, respectively.

Referring to FIG. 1B, first and second recess regions 231 and 232 are spaces in which at least a portion of a first solder 241 and a second solder is disposed when a board 300 of a multilayer ceramic electronic component is mounted. Accordingly, first and second external electrodes 131 and 132 and first and second electrode pads 321 and 322 may be coupled to each other.

The first and second recess regions 231 and 232 may be in a central portion of the insulating body 210, and may be adjacent to the insulating body 210 on one side and the other side in a width direction, respectively. For example, the first and second recess regions 231 and 232 are more closed spaces than a corner of the insulating body 210.

Accordingly, the first solder 241 and the second solder may provide more stable connections between the first and second external electrodes 131 and 132 and the first and second electrode pads 321 and 322 in the first and second recess regions 231 and 232. For example, adhesion strength of the multilayer ceramic electronic component to the board 300 may be further improved.

Portions of the first and second external electrodes 131 and 132 may be disposed on upper sides of the first and second recess regions 231 and 232, respectively. Thus, the first solder 241 and the second solder may provide more stable connection between the first and second external electrodes 131 and 132 and the first and second electrode pads 321 and 322. For example, adhesion strength of the multilayer ceramic electronic to the board 300 component may be further improved.

In the case in which the first and second recess regions 231 and 232 are too small in size, substantial portions of the first solder 241 and the second solder may be disposed to rise up to side surfaces of the first and second external electrodes 131 and 132.

For example, the larger the sizes of the first and second recess regions 231 and 232, the less a ratio of portions rising up to the side surfaces of the first and second external electrodes 131 and 132 to the first solder 241 and the second solder.

Since portions disposed on side surfaces of the first and second external electrodes 131 and 132 may act as paths of acoustic noise, the acoustic noise of the multilayer ceramic electronic component may be more efficiently reduced as the ratio of portions rising up to the side surfaces of the first and second external electrodes 131 and 132 to the first solder 241 and the second solder may be decreased.

For example, the multilayer ceramic electronic component according to an exemplary embodiment may reduce acoustic nose due to the first and second recess regions 231 and 232 that are not too small in size.

In the case in which the first and second recess regions 231 and 232 are too large in size, the first solder 241 and the second solder may be sparsely disposed in the first and second recess regions 231 and 232. Accordingly, bonding strength between the first and second external electrodes and the first and second electrode pads 321 and 322 may be decreased.

As a result, the multilayer ceramic electronic component according to an exemplary embodiment may improve the adhesion strength thereof to the board 300 due to the first and second recess regions 231 and 232 that are not too large in size.

Table (1) shows acoustic noise depending on an area A of each of the first and second recess regions 231 and 232, viewed in a thickness direction, and an area B of each of the first and second terminal electrodes 221 and 222, viewed in the thickness direction. The first and second recess regions 231 and 232 are disposed in centers of one end and the other end of the insulating body 210 in the length direction, respectively. Each of the first and second recess regions 231 and 232 may have a semicircular shape. For example, the area A may be adjusted based on radii of the first and second recess regions 231 and 232.

TABLE 1

| A (mm$^2$) | 0 | 0.0011 | 0.0042 | 0.0093 | 0.0148 | 0.0245 | 0.0344 |
|---|---|---|---|---|---|---|---|
| B (mm$^2$) | | 0.0081 | 0.0156 | 0.0231 | 0.0291 | 0.0375 | 0.0444 |
| A/B | 0 | 0.1414 | 0.2723 | 0.4032 | 0.5079 | 0.6545 | 0.7749 |
| Sample 1 (dB) | 31.3 | 28.2 | 28.8 | 25.3 | 28.5 | 25.4 | 25.8 |
| Sample 2 (dB) | 30.8 | 30 | 28.4 | 28.8 | 25.2 | 28.6 | 25.9 |
| Sample 3 (dB) | 32.5 | 31.6 | 26 | 27.7 | 27.5 | 24.3 | 27.5 |
| Sample 4 (dB) | 34.1 | 25.9 | 28.3 | 26.5 | 25.7 | 27.5 | 25.6 |
| Sample 5 (dB) | 34.4 | 27.9 | 26.8 | 27.6 | 27.7 | 28.1 | 27.8 |
| Sample Average | 32.6 | 28.72 | 27.66 | 27.18 | 26.92 | 26.78 | 26.52 |

Referring to Table (1), the acoustic noise may be rapidly increased when A/B is less than 0.14. Accordingly, the multilayer ceramic electronic component and the interposer 200 are designed in such a manner that A/B is 0.14 or more. As a result, the acoustic noise may be significantly reduced.

Table (2) shows adhesion strength depending on the areas A and B. Experimental conditions of Table (2) are the same as those of Table (1).

TABLE 2

| A (mm$^2$) | 0 | 0.0011 | 0.0042 | 0.0093 | 0.0148 | 0.0245 | 0.0344 |
|---|---|---|---|---|---|---|---|
| B (mm$^2$) | | 0.0081 | 0.0156 | 0.0231 | 0.0291 | 0.0375 | 0.0444 |
| A/B | 0 | 0.1414 | 0.2723 | 0.4032 | 0.5079 | 0.6545 | 0.7749 |
| Sample 1 (N) | 5.4 | 5.5 | 5.4 | 6.5 | 4.2 | 4.8 | 2.1 |
| Sample 2 (N) | 7.3 | 6.3 | 6.4 | 4.6 | 5.7 | 2 | 2 |
| Sample 3 (N) | 5.9 | 5.6 | 5.2 | 6.7 | 4.5 | 2.5 | 1.5 |
| Sample 4 (N) | 5.3 | 6.7 | 6 | 5.4 | 4.9 | 3.6 | 3.2 |
| Sample 5 (N) | 6.8 | 5.8 | 5.7 | 6 | 4.5 | 2.3 | 3.1 |
| Sample 6 (N) | 6.6 | 6.2 | 6.9 | 4.7 | 6.8 | 2.9 | 1.6 |
| Sample 7 (N) | 7.3 | 6.6 | 6.4 | 6.9 | 4.5 | 3.8 | 2.8 |
| Sample 8 (N) | 8.1 | 5.4 | 5.5 | 4.5 | 6.5 | 2.5 | 1.3 |
| Sample 9 (N) | 7.4 | 6.1 | 6.3 | 5.4 | 5.7 | 3.3 | 1.1 |
| Sample 10 (N) | 5.8 | 7.2 | 6.7 | 5.6 | 4 | 2.4 | 2.5 |
| Sample Average | 6.59 | 6.14 | 6.05 | 5.63 | 5.13 | 3.01 | 2.12 |

Referring to Table (2), the adhesion strength may be rapidly decreased when A/B is more than 0.51. Accordingly, the multilayer ceramic electronic component and the interposer 200 are designed in such a manner that A/B is 0.51 or less. As a result, the adhesion strength may be improved.

Figure 4:
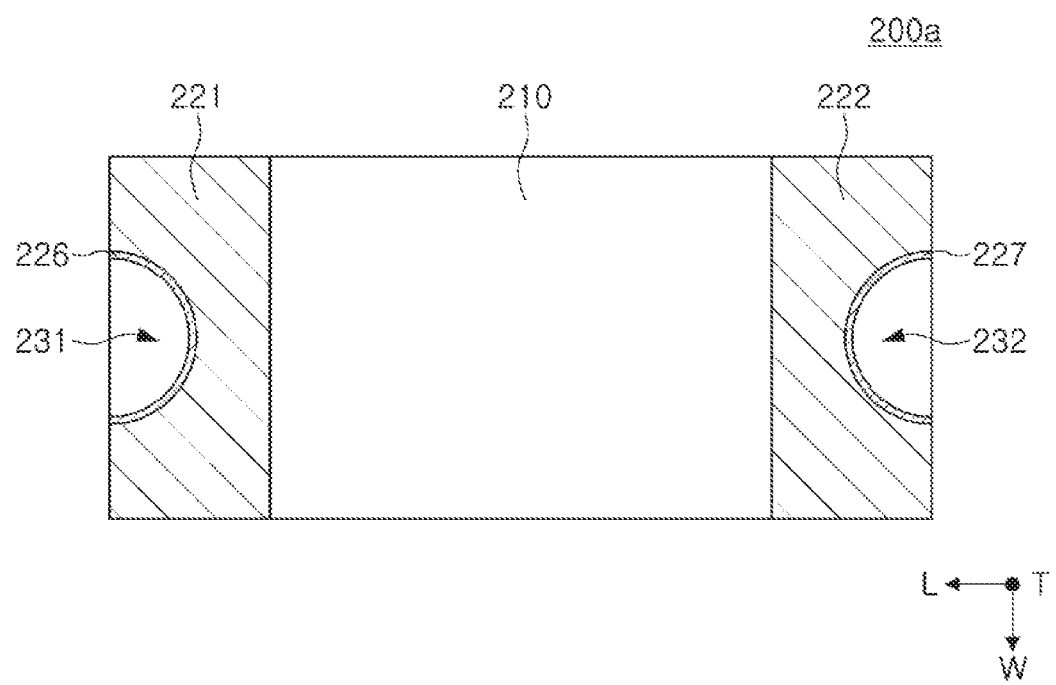
FIG. 4 is a plan view of an interposer included in a multilayer ceramic electronic component according to an exemplary embodiment in the present disclosure.

FIG. 4 is a plan view of an interposer included in a multilayer ceramic electronic component according to an exemplary embodiment in the present disclosure.

Referring to FIG. 4, a multilayer ceramic electronic component and an interposer 200a according to an exemplary embodiment may further include first and second terminal electrode plating layers 226 and 227 disposed on boundaries between first and second recess regions 231 and 232, and an insulating body 210.

The first and second terminal electrode plating layers 226 and 227 may improve bonding strength to the interposer 200a of portions of first and second solders disposed in the first and second recess regions 231 and 232. Thus, the multilayer ceramic electronic component according to an exemplary embodiment may improve adhesion strength to a board.

For example, each of the first and second terminal electrode plating layers 226 and 227 may include tin (Sn). Tin (Sn) has a low melting point and may easily melt into the first and second solders, which may include a tin-copper-silver (Sn—Cu—Ag) alloy paste, during a reflow process. Thus, the multilayer ceramic electronic component according to an exemplary embodiment may improve adhesion strength to a board.

As described above, a multilayer ceramic electronic component according to an exemplary embodiment and an interposer included therein may reduce acoustic noise and improve adhesion strength thereof to a board.

While exemplary embodiments have been shown and described above, it will be apparent to those skilled in the art that modifications and variations could be made without departing from the scope of the present invention as defined by the appended claims.

What is claimed is:
1. A multilayer ceramic electronic component comprising:
a ceramic body including dielectric layers and first and second internal electrodes alternately laminated with each of the dielectric layers disposed therebetween and respectively exposed to a first external surface and a second external surface of the ceramic body;
first and second external electrodes disposed on first and second external surfaces of the ceramic body to be electrically connected to the first and second internal electrodes, respectively;
an interposer including an insulating body disposed on a first side of the ceramic body and having first and second recess regions disposed at first and second ends of the insulating body, in a length direction, and first and second terminal electrodes disposed to cover the first and second ends of the insulating body, respectively, and electrically connected to the first and second external electrodes, respectively;

first and second terminal electrode plating layers disposed on boundaries between the first and second recess regions, respectively, and the insulating body, wherein the first and second recess regions are each disposed in a central region of the insulating body in a width direction, A/B is within a range from 0.14 or more to 0.51 or less, where A is an area of each of the first and second recess regions, viewed in a cross-section in length and width directions, and B is an area of each of the first and second terminal electrodes, viewed in the cross-section in the length and width directions, wherein the first and second terminal electrode plating layers are disposed in the first and second recess regions, respectively, wherein the first and second ends of the insulating body include first and second end surfaces, respectively, opposing each other in the length direction such that the first and second recess regions are arranged between adjacent portions of the first and second end surfaces, respectively, in the width direction, and wherein the first and second terminal electrodes cover at least parts of the adjacent portions of the first and second end surfaces, respectively.

2. The multilayer ceramic electronic component of claim 1, wherein portions of the first and second external electrodes are disposed on upper sides of the first and second recess regions, respectively.

3. The multilayer ceramic electronic component of claim 2, wherein each of the first and second recess regions has a semicircular shape.

4. The multilayer ceramic electronic component of claim 3, wherein centers of semicircular shapes of the first and second recess regions are disposed at centers of the first and second ends of the insulating body, respectively.

5. The multilayer ceramic electronic component of claim 4, further comprising:
a board;
first and second electrode pads disposed on an upper side of the board and electrically connected to the first and second terminal electrodes, respectively; and
first and second solders disposed on top surfaces of the first and second terminal electrodes, first and second solders having at least a portion disposed in the first and second recess regions.

6. An interposer comprising:
an insulating body having first and second recess regions at first and second ends of the insulating body in a length direction;

first and second terminal electrodes disposed to cover the first and second ends of the insulating body, and to cover a portion of an upper surface and a portion of a lower surface of the insulating body; and first and second terminal electrode plating layers disposed on boundaries between the first and second recess regions, respectively, and the insulating body, wherein the first and second recess regions are each disposed in a central region of the insulating body in a width direction, A/B is within a range from 0.14 or more to 0.51 or less, where A is an area of each of the first and second recess regions, viewed in a cross-section in length and width directions, and B is an area of each of the first and second terminal electrodes, viewed in the cross-section in the length and width directions, wherein the first and second terminal electrode plating layers are disposed in the first and second recess regions, respectively, wherein the first and second ends of the insulating body include first and second end surfaces, respectively, opposing each other in the length direction such that the first and second recess regions are arranged between adjacent portions of the first and second end surfaces, respectively, in the width direction, and wherein the first and second terminal electrodes cover at least parts of the adjacent portions of the first and second end surfaces, respectively.

7. The interposer of claim 6, wherein each of the first and second recess regions has a semicircular shape.

8. The interposer of claim 6, wherein each of the first and second terminal electrode plating layers includes tin (Sn).

9. The interposer of claim 8, wherein centers of semicircular shapes of the first and second recess regions are disposed at centers of the first and second ends of the insulating body, respectively.

10. The multilayer ceramic electronic component of claim 1, wherein each of the first and second terminal electrode plating layers includes tin (Sn).

11. The multilayer ceramic electronic component of claim 1, wherein an average thickness of the dielectric layers exceeds twice an average thickness of the first and second internal electrodes.

* * * * *